US008154500B2

(12) United States Patent
Kim

(10) Patent No.: US 8,154,500 B2
(45) Date of Patent: Apr. 10, 2012

(54) GATE DRIVER AND METHOD OF DRIVING DISPLAY APPARATUS HAVING THE SAME

(75) Inventor: Bora Kim, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 939 days.

(21) Appl. No.: 12/143,091

(22) Filed: Jun. 20, 2008

(65) Prior Publication Data

US 2009/0079715 A1 Mar. 26, 2009

(30) Foreign Application Priority Data

Sep. 21, 2007 (KR) ........................ 10-2007-0096858

(51) Int. Cl.
*G09G 3/36* (2006.01)
*G09G 3/00* (2006.01)
*G06F 3/038* (2006.01)
*G11C 19/00* (2006.01)

(52) U.S. Cl. ............ 345/100; 345/204; 345/30; 377/64; 377/81

(58) Field of Classification Search ................... 345/100
See application file for complete search history.

(56) References Cited

U.S. PATENT DOCUMENTS 6,897,846 B2 * 5/2005 Youn .............................. 345/99
2003/0146911 A1 * 8/2003 Nakanishi ...................... 345/211
2008/0158204 A1 * 7/2008 Chang et al. .................. 345/204
2008/0231580 A1 * 9/2008 Hsu ................................ 345/98

OTHER PUBLICATIONS

Tocci, Ronald J. and Neal S. Widmer 7th ed: Digital Principles and applications. ISBN 0-13-700510-5.*
Tocci,Ronals J and Neal S. Widmer 7th ed: Digital Principles and applications. Published 1998. ISBN 0-13-700510-5.*

* cited by examiner

*Primary Examiner* — Alexander S Beck
*Assistant Examiner* — Mihir Rayan
(74) *Attorney, Agent, or Firm* — F. Chau & Associates, LLC

(57) ABSTRACT

A gate driver includes: a shift register and a gate signal generating unit. The shift register unit sequentially outputs scanning signals. The gate signal generating unit generates a normal gate signal and an inverted gate signal based on the scanning signals, controls a charge sharing operation of the normal gate signal and the inverted gate signal, and generates an output gate signal having a rising edge and a falling edge at which a voltage level of the output gate signal is increased and decreased by a charge sharing voltage.

17 Claims, 5 Drawing Sheets

GATE DRIVER AND METHOD OF DRIVING DISPLAY APPARATUS HAVING THE SAME

CROSS REFERENCE TO RELATED APPLICATION

This application claims priority to Korean Patent Application No. 10-2007-96858, filed on Sep. 21, 2007, the disclosure of which is herein incorporated by reference in its entirety.

BACKGROUND OF THE INVENTION

1. Technical Field

The present disclosure relates to a gate driver and a method of driving a display apparatus having the same, and more particularly, to a gate driver and a method of driving a display apparatus that reduces defective images.

2. Discussion of Related Art

A liquid crystal display (LCD) is a display device that adjusts the transmittance of light incident from a light source to display an image by using the optical anisotropy of liquid crystal molecules and a polarization characteristic of a polarizing plate. The LCD has been widely used in various fields because it achieves a light weight, a small size, a high resolution, a large screen, and low power consumption.

The LCD includes a display region and a peripheral region. The display region displays an image. The peripheral region is located outside the display region and applies an electrical signal to the display region. The peripheral region may be provided with a plurality of driving chips to drive a plurality of pixels formed in the display region. For example, gate driving chips for supplying gate signals (e.g., scanning signals) to the respective pixels and data driving chips for supplying image signals (e.g., data signals) may be provided. The gate signal, which is supplied by the gate driving chip is transmitted to a plurality of pixels which are connected by a gate line. As the distance between the gate line and the gate driving chip is increased, parasitic capacitance C caused by a resistance R and an area of the gate line is increased. As a result, the gate signal is delayed by the amount of time corresponding to a time constant ($\gamma$=RC), the time constant being determined by multiplying the resistance and the parasitic capacitance. A gate signal having a higher voltage level can be supplied to prevent the gate signal delay.

However, as the voltage level of the gate signal is increased, the rise and fall times of a gate pulse is shortened and a voltage fluctuation occurs, which causes an increase of a kickback voltage. The excessive kickback voltage is generated in a panel region near the gate driving chip and causes defective images, such as vertical white stripes to appear in the corresponding panel region.

Thus, there is a need for a gate driver and a method of driving a display apparatus that reduces defective images.

SUMMARY OF THE INVENTION

According to an exemplary embodiment of the invention, a gate driver includes a shift register and a gate signal generating unit. The shift register unit sequentially outputs scanning signals. The gate signal generating unit generates a normal gate signal and an inverted gate signal based on the scanning signals, controls a charge sharing operation on the normal gate signal and the inverted gate signal, and generates an output gate signal having a rising edge and a falling edge at which a voltage level of the output gate signal is increased and decreased by a charge sharing voltage.

The voltage level of the output gate signal may be increased by the charge sharing voltage and may be further increased by the normal gate signal to reach a high level, and may be decreased by the charge sharing voltage and may be further decreased by the normal gate signal to reach a low level.

The charge sharing voltage may have a voltage level between the normal gate signal and the inverted gate signal.

The gate signal generating unit may include: first and second logical operation circuit sections that generate a pair of output signals having phases that are opposite to each other, based on the scanning signals, first and second level shifter sections that perform a level shifting operation on output signals of the first and second logical operation circuit sections, first and second output buffer sections that buffer output signals of the first and second level shifter sections, and a charge sharing circuit unit that controls a charge sharing operation on the normal gate signal output by the first output buffer section and the inverted gate signal output by the second output buffer section.

The first logical operation circuit section may include an AND gate that performs an AND operation on one of the scanning signals and an external inverted gate-on control signal to output an operation result, and the second logical operation circuit section may include a NAND gate that performs a NAND operation on the scanning signal and the external inverted gate on control signal to output an operation result.

The charge sharing circuit unit may include a first capacitor that is charged with the normal gate signal, a second capacitor that shares capacitance with the first capacitor and is charged with the inverted gate signal, a first switching element that switches input of the inverted gate signal to the second capacitor, and a second switching element that switches output of voltages charged in the first and second capacitors.

The first switching element may use an N-MOS transistor, and the second switching element may use a P-MOS transistor.

The first and second switching elements may be controlled by a switching signal and perform opposite switching operations to each other.

The switching signal may control the first and second switching elements so that a charge sharing operation of the first and second capacitors is performed at rising and falling edges of the normal gate signal.

The switching signal may be generated by performing an XOR operation on an external gate-on control signal and an external delayed gate-on control signal.

According to an exemplary embodiment of the invention, a method of driving a display apparatus includes: sequentially generating scanning signals, generating a normal gate signal and an inverted gate signal based on the scanning signals, controlling a charge sharing operation on the normal gate signal and the inverted gate signal, generating an output gate signal having a voltage level that is increased by a charge sharing voltage and is further increased by the normal gate signal to reach a high level, and is decreased by the charge sharing voltage and is further decreased by the normal gate signal to reach a low level, and applying the output gate signal to gate lines of a display panel.

The scanning signal may be synchronized with a gate clock signal, and may have one horizontal period.

Generating the output gate signal may include: performing a logical operation on one of the scanning signals and an external gate-on control signal to generate a pair of output signals having phases that are opposite to each other, and shifting voltage levels of the pair of output signals to voltage levels suitable for driving pixels in the display panel.

The pair of output signals may include: an output signal that is generated by performing an AND operation on the scanning signal and an external inverted gate-on control signal and an output signal that is generated by performing a NAND operation on the scanning signal and the external inverted gate-on control signal.

The voltage levels of the pair of output signals may be shifted to a voltage level of a gate-on voltage during a high-level period, and may be shifted to a voltage level of a gate-off voltage during a low-level period.

The charge sharing operation may be controlled such that the charge sharing operation is performed during a high section of a switching signal, is the switching signal being generated by performing an XOR operation on an external gate-on control signal and an external delayed gate-on control signal.

The charge sharing voltage may have a voltage level between the normal gate signal and the inverted gate signal.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
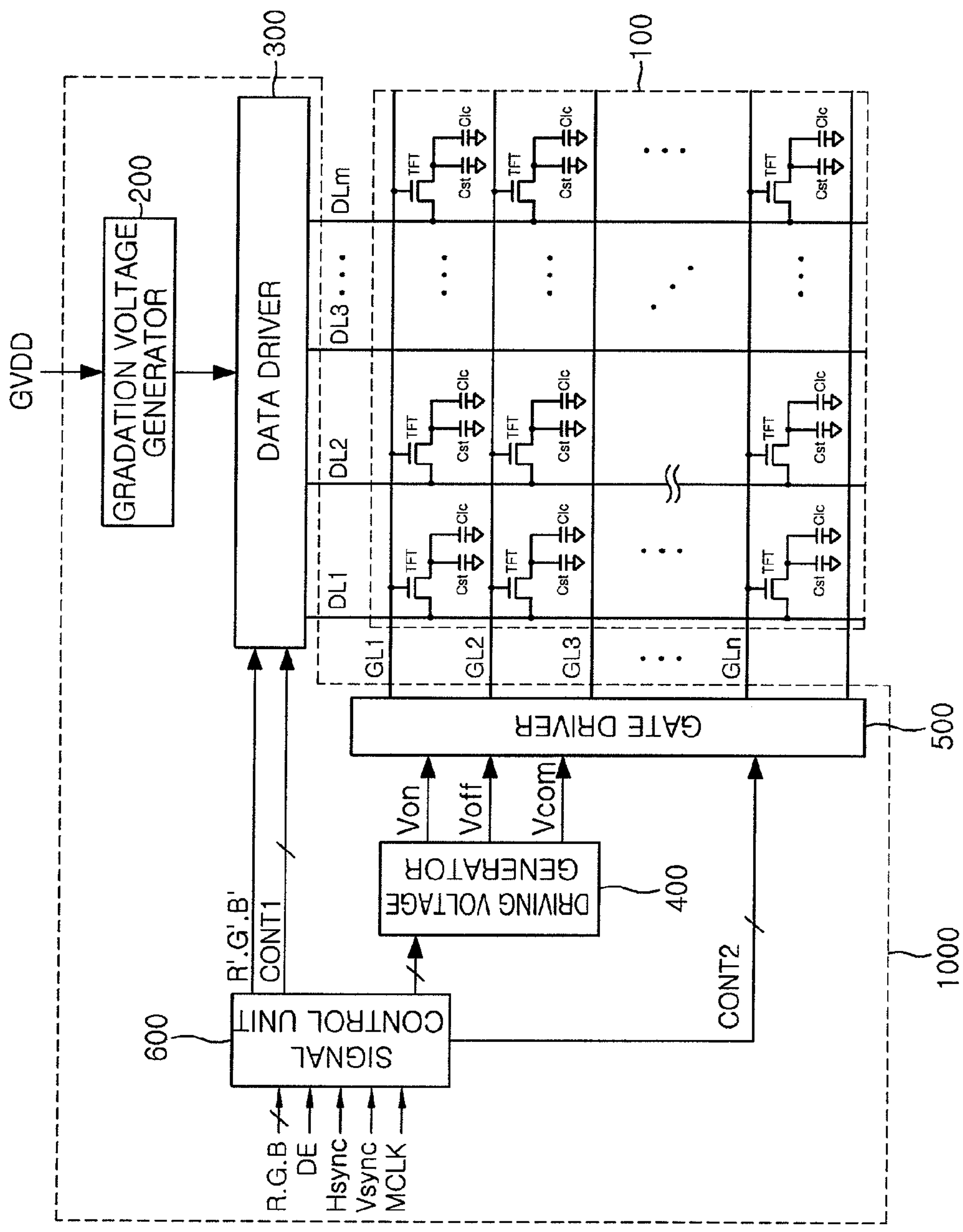
FIG. 1 is a block diagram illustrating an LCD according to an exemplary embodiment of the present invention.

Hereinafter, exemplary embodiments of the invention will be described in detail with reference to the accompanying drawings. The invention may, however, be embodied in many different forms and should not be construed as being limited to the embodiments set forth herein. Like reference numerals refer to like elements throughout the specification.

FIG. 1 is a block diagram illustrating an LCD according to an exemplary embodiment of the present invention. Referring to FIG. 1, an LCD according to an exemplary embodiment of the invention includes an LCD panel 100 and a liquid crystal driving circuit 100. A plurality of pixels are disposed in a matrix in the LCD panel 100. The liquid crystal driving circuit 1000 controls the operation of the plurality of pixels.

The LCD panel 100 includes a plurality of gate lines GL1 to GLn, a plurality of data lines DL1 to DLm, and a plurality of pixels. The plurality of gate lines GL1 to GLn extend in a first direction (e.g., substantially a row direction) and the plurality of data lines DL1 to DLm extend in a second direction (e.g., substantially a column direction). Each pixel includes a thin-film transistor TFT and a liquid crystal capacitor Clc. Each pixel may further include a storage capacitor Cst. A gate electrode of the thin-film transistor TFT is connected to the gate line GL, a source electrode thereof is connected to the data line DL, and a drain electrode thereof is connected to a pixel electrode (not shown) of the liquid crystal capacitor Clc.

The thin-film transistor TFT is a switching element for independently controlling each pixel. The thin-film transistor TFT is turned on by a gate signal (e.g., a gate-on voltage Von) applied to the gate line GL, and applies a data signal (e.g., a gradation voltage) from the data line DL to the liquid crystal capacitor Clc and the storage capacitor Cst. The liquid crystal capacitor Clc includes a pixel electrode and a common electrode (not shown) facing each other, and a liquid crystal layer as a dielectric is disposed therebetween. When the thin-film transistor TFT is turned on, the data signal is charged in the liquid crystal capacitor Clc and controls an alignment of liquid crystal molecules. The storage capacitor Cst includes a pixel electrode (not shown) and a storage electrode (not shown) facing each other, and an insulating film as a dielectric is disposed therebetween. The storage capacitor Cst stores the data signal charged in the liquid crystal capacitor Clc until a next data signal is charged. The storage electrode of the storage capacitor Cst is connected to a storage line (not shown) extending in parallel to a direction in which the gate line GL extends. The storage capacitor Cst and the storage line may be omitted, if necessary. Each pixel may uniquely display one of the three primary colors (e.g., red, green, and blue) by providing each pixel with one of a red color filter R, a green color filter G, and a blue color filter B. A black matrix (not shown) is provided between pixel regions to prevent light leakage. The black matrix may be provided to correspond to a region where the signal lines GL and DL are formed.

The liquid crystal driving circuit 1000 may be provided outside the LCD panel 100. The liquid crystal driving circuit 1000 includes a gradation voltage generator 200, a data driver 300, a driving voltage generator 400, a gate driver 500, and a signal control unit 600 controlling the above-described elements. Parts of the liquid crystal driving circuit 1000, for example, the data driver 300 and the gate driver 500 may be provided outside the pixel region in the LCD panel 100. The gate driver 500 may be directly formed on a lower substrate of the LCD panel 100 using an amorphous silicon gate (ASG) method. Alternatively, the gate driver 500 may be separately manufactured, and may be mounted on the lower substrate of the LCD panel 100 using a chip on board (COB) method, a tape automated bonding (TAB) method, a chip on glass (COG) method, or other similar method. The gate driver 500 may be formed of a plurality of driving chips that are respectively connected to the plurality of gate lines GL1 to GLn, and mounted on the lower substrate.

The signal control unit 600 receives input image signals and input control signals from an external graphic controller (not shown). For example, the signal control unit 600 receives the input image signals including image data R, G, and B, and the input control signals including a vertical synchronization signal Vsync, a horizontal synchronization signal Hsync, a main clock MCLK, and a data enable signal DE. The signal control unit 600 appropriately processes the input image signal according to operation conditions of the LCD panel 100 to generate internal image data R', G', and B'. Further, the signal control unit 600 generates a data control signal CONT1 and a gate control signal CONT2 based on the input control signals. The image data R', G', and B' and the data control signal CONT1 are applied to the data driver 300. The data control signal CONT1 includes: a horizontal synchronization start signal STH for indicating a transmission start of the image data R', G', and B', a load signal LOAD for instructing to supply a data signal to a corresponding data line, an inversion signal RVS for inverting a polarity of a gradation voltage with respect to a common voltage, and a data clock signal DCLK. The gate control signal CONT2 is applied to the gate driver 500, and includes a vertical synchronization start signal STV for instructing an output start of a gate on voltage Von, a gate clock signal CPV, and a gate-on control signal OE. The gate-on control signal OE defines a pulse width of a gate signal applied to the gate line.

The gradation voltage generator 200 divides a gamma voltage GVDD to generate a plurality of levels of gradation voltages, and outputs the plurality of levels of gradation voltages to the data driver 300. The gradation voltage generator 200 includes a plurality of resistors (e.g., a resistor string) connected in series between a high-potential power supply (e.g., a gamma voltage GVDD) and a low-potential power supply (e.g., a ground voltage VSS). Variable resistors may be additionally connected between the resistors to more precisely control dividing intervals of the division voltages that are output from nodes between the resistors connected in series. The gradation voltage generator 200 may generate a pair of gradation voltages having opposite polarities (e.g., positive and negative gradation voltages) and supply gradation voltages having opposite polarities to the data driver 300. Although the gradation voltage generator 200 has been described as including a resistor string, the present invention is not limited thereto. For example, the gradation voltage generator 200 may include various types of voltage dividing units capable of generating a plurality of gradation voltages using a gamma voltage GVDD and a ground voltage VSS. While the gradation voltage generator 200 may be provided as a separate module outside the data driver 300, the present invention is not limited thereto. For example, the gradation voltage generator 200 may be integrated with the data driver 300.

The data driver 300 converts the digital image data R', G', and B' into analog image data using the gradation voltages supplied by the gradation voltage generator 200, and applies the image data as data signals to the corresponding data lines DL1 to DLm. The data signals DS can be generated using a positive gradation voltage or a negative gradation voltage. The polarities of the data signals DS may be inverted according to the inversion signal RVS of the signal control unit 600, and applied to the corresponding data lines DL1 to DLm. A pair of data signals having a positive (+) and a negative (−) polarity with respect to the common voltage Vcom may be alternately applied to successive dots, successive lines, successive columns, or successive frames. The common voltage is applied to the common electrode to prevent degradation of pixels.

The driving voltage generator 400 can generate and output various driving voltages to drive the LCD panel 100 by using an external voltage supplied by an external power supply. For example, the driving voltage generator 400 generates a gate-on voltage Von turning on a thin-film transistor (TFT) and a gate-off voltage Voff turning off the TFT, and supplies the gate-on voltage Von and the gate-off voltage Voff to the gate driver 500. The driving voltage generator 400 generates the common voltage Vcom and applies the common voltage Vcom to the common electrode and the storage electrode. The gamma voltage GVDD, which is supplied by the gradation voltage generator 200, may be generated by the driving voltage generator 400.

The gate driver 500 starts an operation according to the vertical synchronization start signal STV. The gate driver 500 is synchronized with the gate clock signal CPV, and sequentially outputs the analog gate signals including the gate-on voltage Von and the gate-off voltage Voff supplied from the driving voltage generator 400 to the plurality of gate lines GL1 to GLm formed in the LCD panel 100. Agate signal having a voltage level of the gate-on voltage Von may be output during a high section of the gate clock signal CPV.

Figure 2:
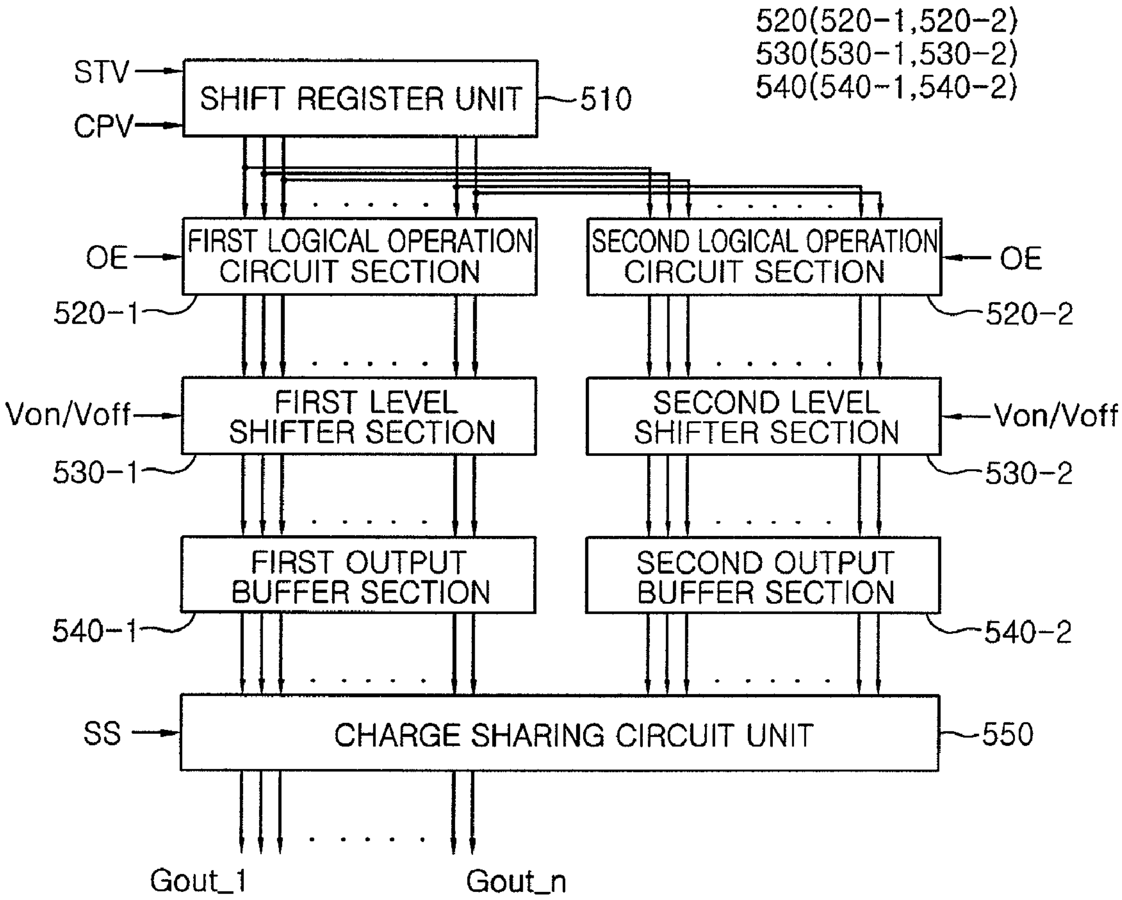
FIG. 2 is a block diagram illustrating a gate driver according to an exemplary embodiment of the invention.

FIG. 2 is a block diagram illustrating a gate driver according to an exemplary embodiment of the invention. Referring to FIG. 2, the gate driver 500 includes: a shift register unit 510 and a gate signal generating unit including a logical operation circuit unit 520, a level shifter unit 530, an output buffer unit 540, and a charge sharing circuit unit 550. The shift register unit 510 sequentially outputs scanning signals in response to the gate control signals STV and CPV output from the signal control unit 600. The gate signal generating unit generates a normal gate signal and an inverted gate signal based on the scanning signals, controls a charge sharing operation of the normal gate signal and the inverted gate signal, and generates an output gate signal having a rising edge and a falling edge at which the voltage level of the output gate signal rises and falls by the charge sharing voltage. The logical operation circuit unit 520 includes first and second logical operation circuit sections 520-1 and 520-2 for generating a pair of output signals having opposite phases with respect to each other based on the scanning signals. The level shifter unit 530 includes first and second level shifter sections 530-1 and 530-2 for shifting voltage levels of output signals of the first and second logical operation circuit sections 520-1 and 520-2 to a voltage level suitable for driving pixels. The output buffer unit 540 includes first and second output buffer sections 540-1 and 540-2 for buffering output signals of the first and second level shifter sections 530-1 and 530-2. The charge sharing circuit unit 550 controls a charge sharing operation of the normal gate signal and the inverted gate signal. The normal gate signal is an original gate signal output from the first output buffer section 540-1, and the inverted gate signal is output from the second output buffer section 540-2 and has a phase opposite to the gate signal.

The shift register unit 510 starts an operation according to the vertical synchronization start signal STV, and sequentially generates and outputs scanning signals, which are synchronized with the gate clock signal CPV. The shift register unit 510 includes a plurality of shift registers that are subordinately connected. For example, the first shift register of the plurality starts an operation according to the vertical synchronization start signal STV, and the second shift register of the plurality starts an operation according to an output signal (e.g., a carry signal) of the first shift register. In this way, all of the shift registers may be sequentially driven.

The logical operation circuit unit 520 includes the first and second logical operation circuit sections 520-1 and 520-2. The first and second logical operation circuit sections 520-1 and 520-2 perform a logical operation on a scanning signal, which is input from the shift register unit 510, and a gate-on control signal OE, which is input from the signal control unit 600, and generate a pair of output signals having phases that are opposite to each other. The logical operation circuit unit 520 controls the pulse width of the scanning signal according to the gate-on control signal OE. An inversion signal of the gate-on control signal OE may be used to control timing. The first logical operation circuit section 520-1 may include an AND gate that performs an AND operation on the scanning signal and the inverted gate-on control signal OE' to output an operation result. The second logical operation circuit section 520-2 may include a NAND gate that performs a NAND operation on the scanning signal and the inverted gate on control signal OE' to output an operation result.

The level shifter unit 530 includes the first level shifter section 530-1 and the second level shifter section 530-2. The first level shifter section 530-1 performs a level shifting operation on the output signal of the first logical operation circuit section 520-1. The second level shifter section 530-2 performs a level shifting operation on the output signal of the second logical operation section 520-2. The output signals of the first and second level shifter sections 530-1 and 530-2 may be shifted to a voltage level of either the gate-on voltage Von or the gate-off voltage Voff.

The output buffer unit 540 includes the first output buffer section 540-1 and the second output buffer section 540-2. The first output buffer section 540-1 buffers and outputs the output signal of the first level shifter section 530-1. The second output buffer section 540-2 buffers and outputs the output signal of the second level shifter section 530-2. The output signal from the first output buffer section 540-1 (e.g., the normal gate signal) has a phase opposite to the output signal from the second output buffer section 540-2 (e.g., the inverted gate signal). In terms of timing, a rising section of the normal gate signal corresponds to a falling section of the inverted gate signal, and a falling section of the normal gate signal corresponds to the rising section of the inverted gate signal.

The charge sharing circuit unit 550 controls the charge sharing operation of the normal gate signal and the inverted gate signal, and outputs the output gate signal having a rising edge and a falling edge at which the voltage level of the output gate signal rises and falls by the charge sharing voltage. The output gate signal is output to the gate line connected to the charge sharing circuit unit 550. The voltage level of the output gate signal Gout_1 to Gout_n is increased by the charge sharing voltage of the normal gate signal and the inverted gate signal, and is then further increased by the normal gate signal to reach a high level. The voltage level of the output gate signal is decreased by the charge sharing voltage of the normal gate signal and the inverted gate signal, and is then further decreased by the normal gate signal to reach a low level.

The gate driver 500 may include a plurality of gate driving chips that respectively connect to the plurality of gate lines GL1 to GLn. Hereinafter, an n-th gate driving chip connected to an n-th gate line GLn will be used for illustrative purposes to describe the configuration and operation of the gate driver 500.

Figure 3:
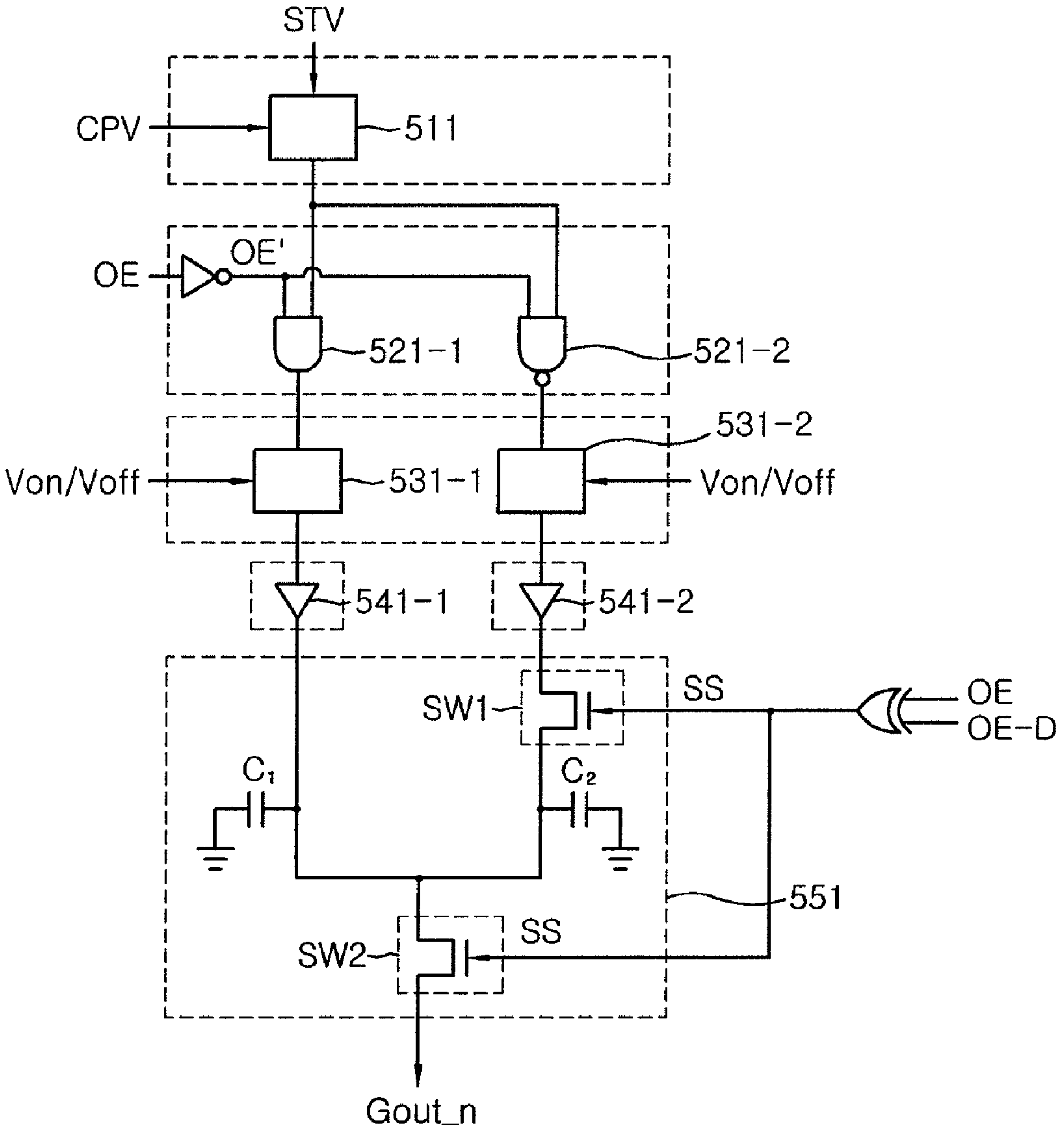
FIG. 3 is a circuit diagram illustrating a gate driving chip according to an exemplary embodiment of the invention.
Figure 4:
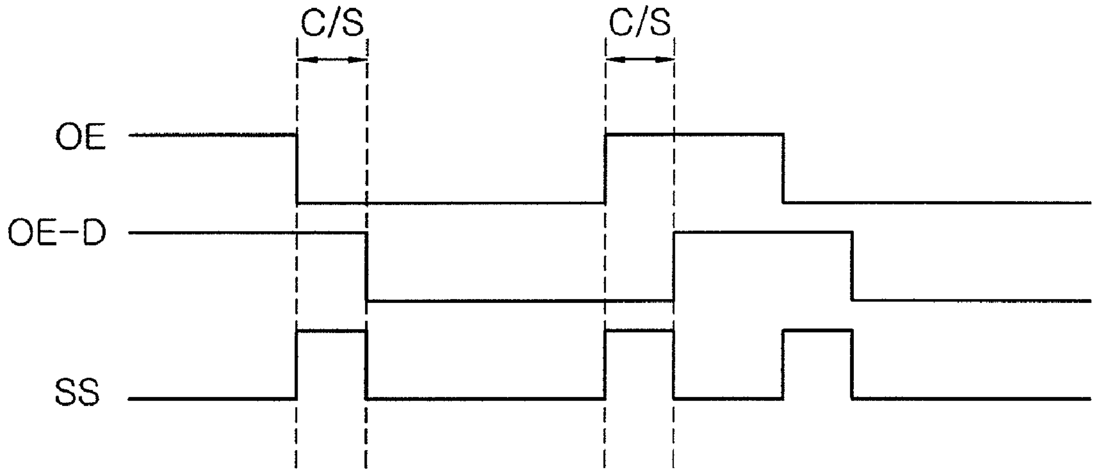
FIG. 4 is a waveform diagram of a switching signal used in a charge sharing circuit shown in FIG. 3.
Figure 5:
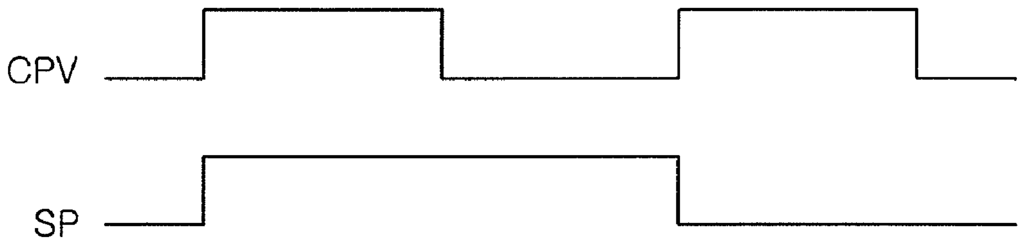
FIG. 5 is a timing diagram illustrating the operation of a shift register shown in FIG. 3.
Figure 6:
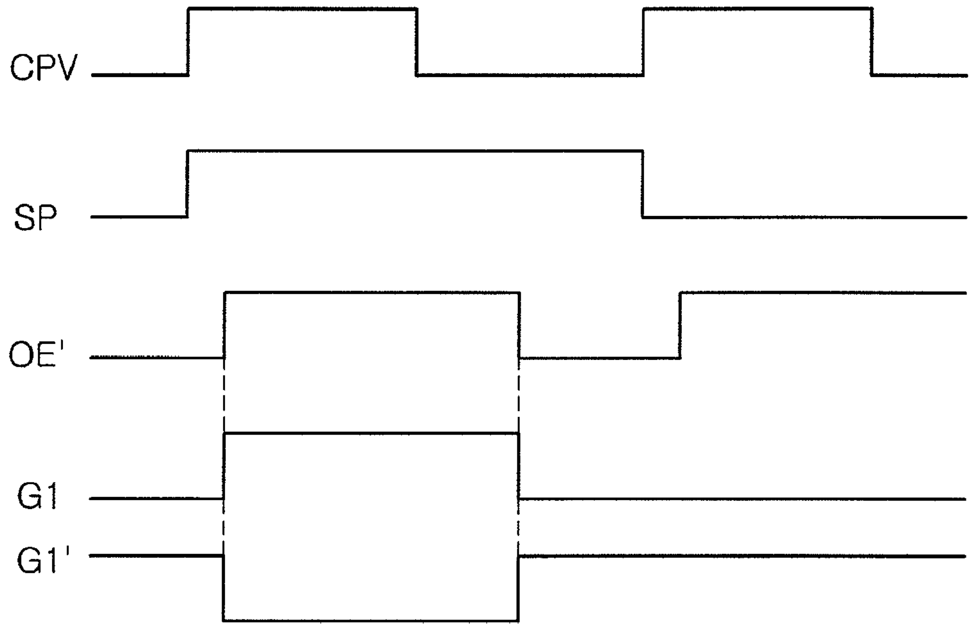
FIG. 6 is a timing diagram illustrating the operation of a logical operation circuit shown in FIG. 3.
Figure 7:
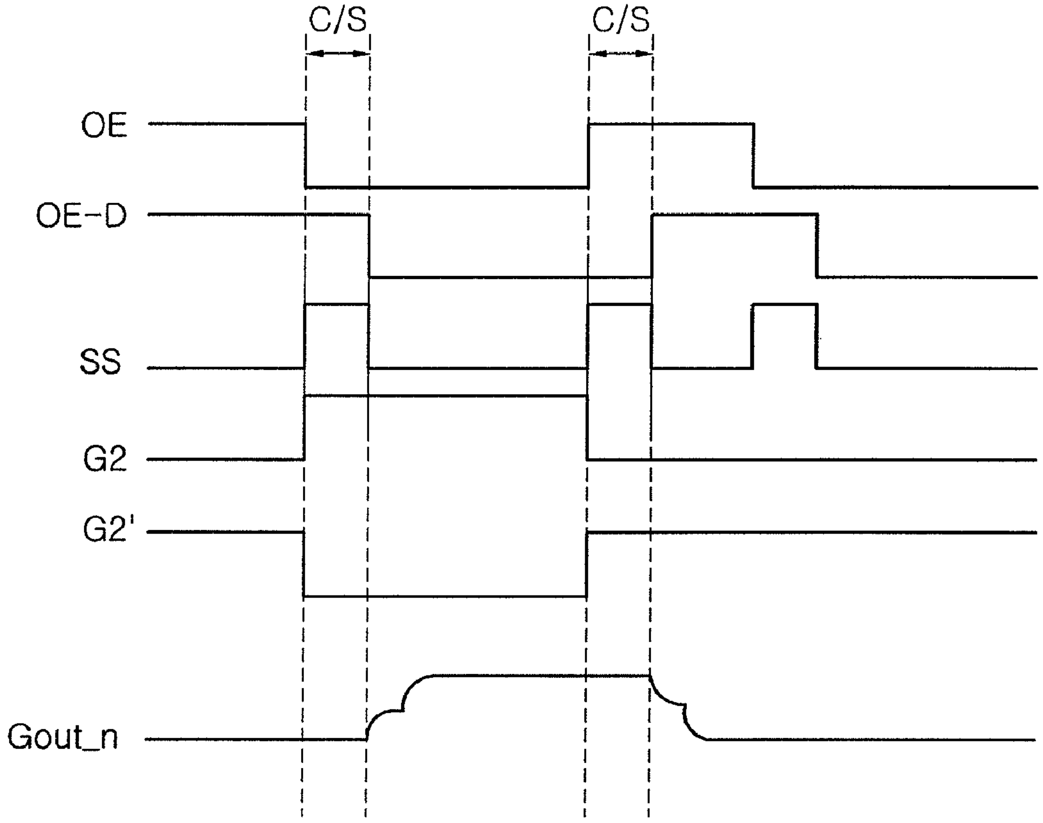
FIG. 7 is a timing diagram illustrating the operation of the charge sharing circuit shown in FIG. 3.

FIG. 3 is a circuit diagram illustrating a gate driving chip according to an exemplary embodiment of the invention. FIG. 4 is a waveform diagram of a switching signal used in a charge sharing circuit shown in FIG. 3. FIG. 5 is a timing diagram illustrating the operation of a shift register shown in FIG. 3. FIG. 6 is a timing diagram illustrating the operation of a logical operation circuit shown in FIG. 3. FIG. 7 is a timing diagram illustrating the operation of a charge sharing circuit shown in FIG. 3.

Referring to FIG. 3, the gate driving chip includes a shift register 511, a first logical operation circuit 521-1, a second logical operation circuit 521-2, a first level shifter 531-1, a second level shifter 531-2, a first output buffer 541-1, a second output buffer 541-2, and a charge sharing circuit 551.

The charge sharing circuit 551 includes a first capacitor $C_1$, a second capacitor $C_2$, a first switching element SW1, and a second switching element SW2. The first capacitor $C_1$ is charged by the normal gate signal. The second capacitor $C_2$ shares capacitance with the first capacitor $C_1$ and is charged with the inverted gate signal. The first switching element SW1 switches the input of the inverted gate signal to the second capacitor $C_2$, and the second switching element SW2 switches the output of the voltage charged in the first and second capacitors $C_1$ and $C_2$. The first and second switching elements SW1 and SW2 may be controlled by a switching signal SS and perform opposite switching operations to each other. For example, the first switching element SW1 may include a P-MOS transistor that is turned on during a high section of the switching signal SS. The second switching element SW2 may include an N-MOS transistor that is turned on during a low section of the switching signal SS. The timing of the switching signal SS is set such that the charge sharing operation by the first and second capacitors $C_1$ and $C_2$ is performed during the rising and falling sections of the normal gate signal output from the first output buffer 541-1. As shown in FIG. 4, the switching signal SS is obtained by performing an XOR operation on the gate-on control signal OE instructing output of the gate signal, and a delayed gate on control signal OE-D obtained by delaying the gate-on control signal OE for a predetermined amount of time. The switching signal SS has a rising edge at the rising and falling edges of the gate-on control signal OE, and has a high section as long as the delay time of the delayed gate-on control signal OE-D. The charge sharing operation is performed during the high section.

Referring to FIG. 5, the shift register 511 starts an operation according to the vertical synchronization start signal STV, generates a scanning signal SP synchronized with a rising edge of the gate clock signal CPV, and supplies the scanning signal to the first logical operation circuit 521-1 and the second logical operation circuit 521-2. A pulse width of the scanning signal SP during a high section may be the same as a pulse cycle of the gate clock signal CPV. The scanning signal SP may have one horizontal period. At a falling edge of a previous scanning signal, a rising edge of a following scanning signal starts.

The first logical operation circuit 521-1 performs an AND operation on the scanning signal SP and the inverted gate-on control signal OE' and outputs a pulse signal G1 as an operation result. The second logical operation circuit 521-2 performs a NAND operation on the scanning signal SP and the inverted gate-on control signal OE' and outputs a pulse signal G1' as an operation result. As shown in FIG. 6, the first logical operation circuit 521-1 outputs the pulse signal G1 having a high section during an overlapping period of a high section of the scanning signal SP and a high section of the inverted gate-on control signal OE'. The second logical operation circuit 521-2 outputs the pulse signal G' having a low section during an overlapping period of a high-level period of the scanning signal SP and a high-level period of the inverted gate on-control signal OE'. The first and second logical operation circuits 521-1 and 521-2 output the pulse signals G1 and G1' having phases that are opposite to each other.

The pulse signals G1 and G1', which are output from the first and second logical operation circuits 521-1 and 521-2, are respectively input to the first and second level shifters 531-1 and 531-2, and voltage levels thereof are shifted to voltage levels suitable for driving pixels. The high section of the output pulse signal is shifted to the voltage level of the gate-on voltage Von, and the low section is shifted to the voltage level of the gate-off voltage Voff to turn on or turn off the TFT in each pixel. The output signals of the first and second level shifters 531-1 and 531-2 are buffered by the first and second output buffers 541-1 and 541-2 for a predetermined amount of time, and are then output to the charge sharing circuit 551.

Referring to FIG. 7, at the falling edge of the gate-on control signal OE, the voltage level of the switching signal SS is shifted from a low level to a high level. Accordingly, the first switching element SW1 is turned on and the second switching element SW2 is turned off. As a result, an output signal of the first output buffer 541-1 (e.g., the normal gate signal G2) is charged in the first capacitor $C_1$, and an output signal of the second output buffer 541-2 (e.g., the inverted gate signal G2') is charged in the second capacitor $C_2$. The first and second capacitors $C_1$ and $C_2$ are electrically connected to each other and share capacitance. Thus, the charge sharing voltage of the normal gate signal G2 and the inverted gate signal G2' is applied to an input terminal of the second switch SW2, which corresponds to an output terminal. When the voltage level of the switching signal SS is shifted from a high level to a low level at the falling edge of the delayed gate-on control signal OE-D, the first switching element SW1 is turned off, and the second switching element SW2 is turned on. The normal gate signal G2 output from the first output buffer 541-1, and the charge sharing voltage charged in the first and second capacitors $C_1$ and $C_2$ are output to the gate line GLn. Accordingly, the voltage level of the final gate signal, which is output to the n-th gate line GLn (e.g., the voltage level of the output gate signal Gout_n) is increased by the charge sharing voltage having a voltage level between the normal gate signal G2 and the inverted gate signal G2' (e.g., an average voltage), and is further increased by the normal gate signal G2, thereby reaching the voltage level of the high section.

The charge sharing operation of the normal gate signal G2 and the inverted gate signal G2' is performed not only during the rising section of the output gate signal Gout_n, but also during the falling section thereof. During the falling section, the first switching element SW1 is turned on, and the second switching element SW2 is turned off. As a result, the output signal of the first output buffer 541-1 (e.g., the normal gate signal G2) is charged in the first capacitor $C_1$ and the output signal of the second output buffer 541-2 (e.g., the inverted gate signal G2') is charged in the second capacitor $C_2$. Then, the first switching element SW1 is turned off and the second switching element SW2 is turned on. As a result, the normal gate signal G2, which is output by the first output buffer 541-1, and the charge sharing voltage charged in the first and second capacitors $C_1$ and $C_2$ are output to the gate line GLn. Accordingly, the voltage level of the output gate signal Gout_n is decreased by the charge sharing voltage having the average voltage level of the normal gate signal G2 and the inverted gate signal G2', and is further decreased by the normal gate signal G2, thereby reaching the voltage level of the low section.

The voltage level of the output gate signal Gout_n, which is output from the charge sharing circuit 551, is increased and decreased by the charge sharing voltage having the average voltage level of the normal gate signal G2 and the inverted gate signal G2'. Thus, the voltage level of the output signal is changed step-by-step, and the rising time and the falling time of the gate-on pulse are increased. As a result, the kickback voltage is not excessively increased even though the voltage level of the output gate signal Gout_n is further increased as compared with a conventional LCD. An excessive kickback voltage is not generated in the panel region near the gate driver 500. Accordingly, defective images such as vertical white stripes, (e.g., a whitish phenomenon caused by the excessive kickback voltage in the panel region near the gate driver 500) can be prevented. Further, the operation control of the charge sharing circuit 551 can be performed by using the gate-on control signal OE of a conventional liquid crystal driving circuit. Thus, except for the gate driver 500, a liquid crystal driving circuit of a conventional LCD may be used unchanged.

In at least one exemplary embodiment of the invention, the voltage level of the output gate signal is changed step-by-step at a rising edge and a falling edge by performing a charge sharing operation on the normal gate signal and the inverted gate signal. Therefore, the excessive kickback voltage is not generated, even when the voltage level of the output gate signal is increased.

Further, according to at least one exemplary embodiment of the invention, the kickback voltage is not excessively generated even though the voltage level of the output gate signal is further increased as compared with a conventional LCD. Therefore, a defective image due to the excessive kickback voltage caused by an increased output level of an output gate signal can be prevented, while preventing a signal delay by increasing the output level of the output gate signal.

In the above-described embodiments, the LCD has been exemplified as the display apparatus, but the invention is not limited thereto. The invention may be applied to various display apparatuses in which unit pixels are disposed in a matrix form. For example, the invention may also be applied to various display apparatuses such as a plasma display panel (PDP), an organic EL (Electroluminescence), and the like.

Although the invention has been described with reference to the accompanying drawings and the exemplary embodiments, it should be noted that various changes and modifications can be made by those skilled in the art without departing from the technical spirit of the invention.

What is claimed is:

1. A gate driver comprising:

a shift register unit that sequentially outputs scanning signals; and a gate signal generating unit that generates a normal gate signal and an inverted gate signal based on the scanning signals, controls a charge sharing operation on the normal gate signal and the inverted gate signal, and generates an output gate signal having a rising edge and a falling edge at which a voltage level of the output gate signal is increased and decreased by a charge sharing voltage, wherein the gate signal generating unit comprises a charge sharing circuit unit that comprises:

a first capacitor that is charged with the normal gate signal;

a second capacitor that shares capacitance with the first capacitor and is charged with the inverted gate signal;

a first switching element that switches input of the inverted gate signal to the second capacitor; and a second switching element that switches output of voltages charged in the first and second capacitors.

2. The gate driver of claim 1, wherein the voltage level of the output gate signal is increased by the charge sharing voltage and is further increased by the normal gate signal to reach a high level, and wherein the voltage level of the output gate signal is decreased by the charge sharing voltage and is further decreased by the normal gate signal to reach a low level.

3. The gate driver of claim 2, wherein the charge sharing voltage has a voltage level between the normal gate signal and the inverted gate signal.

4. The gate driver of claim 1, wherein the gate signal generating unit comprises:

first and second logical operation circuit sections that generate a pair of output signals having phases that are opposite to each other, based on the scanning signals;

first and second level shifter sections that perform a level shifting operation on output signals of the first and second logical operation circuit sections; and first and second output buffer sections that buffer output signals of the first and second level shifter sections.

5. The gate driver of claim 4, wherein the first logical operation circuit section comprises an AND gate that performs an AND operation on one of the scanning signals and an external inverted gate-on control signal to output an operation result, and the second logical operation circuit section comprises a NAND gate that performs a NAND operation on one of the scanning signals and the external inverted gate-on control signal to output an operation result.

6. The gate driver of claim 1, wherein the first switching element uses an N-MOS transistor, and the second switching element uses a P-MOS transistor.

7. The gate driver of claim 6, wherein the first and second switching elements are controlled by a switching signal and perform opposite switching operations to each other.

8. The gate driver of claim 7, wherein the switching signal controls the first and second switching elements so that a charge sharing operation of the first and second capacitors is performed at rising and falling edges of the normal gate signal.

9. The gate driver of claim 6, wherein the switching signal is generated by performing an XOR operation on an external gate-on control signal and an external delayed gate-on control signal.

10. A method of driving a display apparatus, the method comprising:

sequentially generating scanning signals;

generating a normal gate signal and an inverted gate signal based on the scanning signals;

controlling a charge sharing operation on the normal gate signal and the inverted gate signal;

generating an output gate signal having a voltage level that is increased by a charge sharing voltage and is further increased by the normal gate signal to reach a high level, and is decreased by the charge sharing voltage and is further decreased by the normal gate signal to reach a low level; and applying the output gate signal to gate lines of a display panel, wherein the charge sharing operation is controlled such that the charge sharing operation is performed during a high section of a switching signal, and wherein the switching signal is generated by performing an XOR operation on an external gate-on control signal and an external delayed gate-on control signal.

11. The method of claim 10, wherein the scanning signals are synchronized with a gate clock signal, and have one horizontal period.

12. The method of claim 10, wherein generating the output gate signal comprises:

performing a logical operation on one of the scanning signals and the external gate-on control signal to generate a pair of output signals having phases that are opposite to each other; and shifting voltage levels of the pair of output signals to levels suitable for driving pixels in the display panel.

13. The method of claim 12, wherein the pair of output signals comprises:

an output signal generated by performing an AND operation on the scanning signal and the external inverted gate-on control signal; and an output signal generated by performing a NAND operation on the scanning signal and the external inverted gate on-control signal.

14. The method of claim 12, wherein a high section of voltage levels of the pair of output signals is shifted to a voltage level of a gate-on voltage, and a low section thereof is shifted to a voltage level of a gate-off voltage.

15. The method of claim 10, wherein the charge sharing voltage has a voltage level between the normal gate signal and the inverted gate signal.

16. A gate driver comprising:

a shift register unit that sequentially outputs scanning signals;

a gate signal generating unit that generates a normal gate signal and an inverted gate signal based on the scanning signals;

a first capacitor that is charged with the normal gate signal; and a second capacitor that shares a capacitance with the first capacitor and is charged with the inverted gate signal, wherein the gate signal generating unit generates a shared charge from the normal gate signal and the inverted gate signal when a control signal having a first logic level is received and outputs a signal based on the shared charge and the normal gate signal when the control signal is received with the second logic level, and wherein the first logic level differs from the second logic level, as claimed (EMPHASIS ADDED).

17. The gate driver of claim 16, further comprising:

a first switching element that switches input of the inverted gate signal to the second capacitor in response to the control signal; and a second switching element that switches output of voltages charged in the first and second capacitors in response to the control signal.

* * * * *